United States Patent [19]
Johnston

[11] Patent Number: 6,123,588
[45] Date of Patent: Sep. 26, 2000

[54] CIRCUIT TRACE TERMINATION AND METHOD

[75] Inventor: James J. Johnston, St. Petersburg, Fla.

[73] Assignee: The Wiremold Company, West Hartford, Conn.

[21] Appl. No.: 09/333,817

[22] Filed: Jun. 15, 1999

[51] Int. Cl.[7] .................................................. H01R 4/02
[52] U.S. Cl. ........................................ 439/876; 439/493
[58] Field of Search ................................. 439/493, 876, 439/67

[56] References Cited

U.S. PATENT DOCUMENTS 5,857,259   2/1995   Johnston ................................... 29/858

*Primary Examiner*—Lincoln Donovan
*Assistant Examiner*—Javaid Nasri

*Attorney, Agent, or Firm*—McCormick, Paulding & Huber LLP

[57] ABSTRACT

Metallic circuit traces disposed on a substrate of a panel and terminated in a high-density in-line array. Each termination comprises a terminal portion of a circuit trace disposed on and extending along a beam defined by the panel, a portion of a resilient compressible electrical conductor disposed in overlying relation to at least an associated part of the terminal portion, and a cradle assembly including a cradle member and a cap ultrasonically welded together in assembly generally within a common plane of joinder spaced from the substrate. The cradle assembly surround portions of the beam, the terminal portion, and the conductor and maintains the conductor under compression and in electrical contacting engagement with the terminal portion to form an electrical termination.

6 Claims, 4 Drawing Sheets

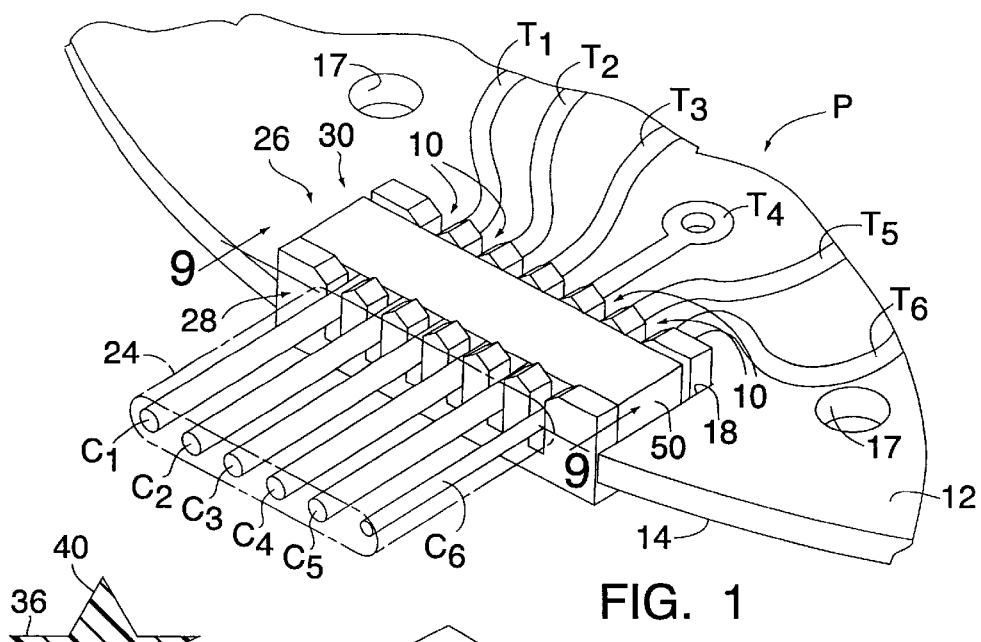
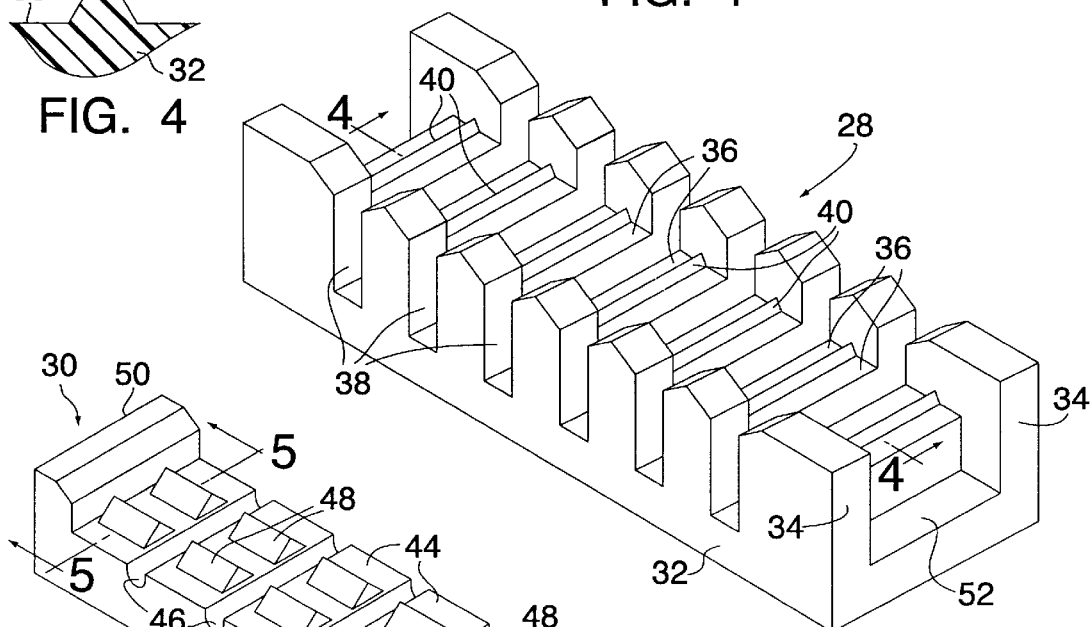
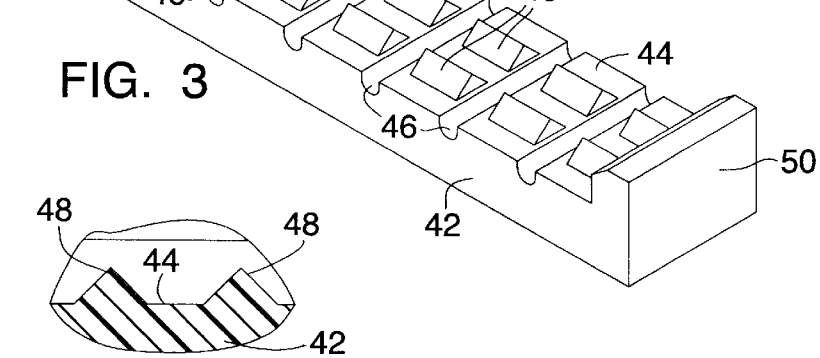

CIRCUIT TRACE TERMINATION AND METHOD

FIELD OF INVENTION

This invention relates in general to electrical terminations and terminating methods and deals more particularly with improved terminations for electrical circuit traces on panels and printed circuit boards and methods for making such terminations.

BACKGROUND OF THE INVENTION

This invention relates in general to electrical connections and terminations and deals more particularly with improved terminations for circuit traces disposed on surfaces of panels, circuit boards and the like and particularly termination of metallic circuit traces of the etched copper variety.

Such circuit traces are suitable for termination by several standard termination techniques, including edge connection for printed circuit boards employing a stiffener or paddle board approach, soldering or welding including laser techniques, contact piercing type print terminations and pressure or spring termination designs. However, each of the aforesaid generally accepted techniques has limitations. Termination techniques which employ solder, for example, may be wholly unacceptable for many medical applications. Conventional mechanical termination techniques often prove troublesome where the device having the terminations is or may be exposed to frequent shock and/or vibration, as, for example, in automotive applications. Further, many of the standard termination techniques impose limitations upon the spacing which must be provided between adjacent terminations making these techniques generally unsuitable for use where high-density in-line termination is required.

The present invention is concerned with the afore-described general problems.

Accordingly, it is the general aim of the present invention to provide an improved metallic circuit trace termination highly resistive to shock and vibration and which enables maximization of termination density.

SUMMARY OF THE INVENTION

In accordance with the present invention, a printed circuit termination comprises a panel at least a portion of which is substantially rigid, defines a beam, and has generally parallel upper and lower surfaces, at least one of the surfaces defining a substrate. A circuit trace carried by the substrate has a terminal portion which extends along a portion of the substrate defined by the beam. A resilient compressible electrical conductor is disposed in overlying electrical contacting engagement with the terminal portion. The termination further includes an ultrasonically weldable cradle assembly formed by a cradle member and an energy director cap member. The energy director cap cooperates in assembly with the cradle member to define a termination barrel receiving and confining therein at least parts of the beam, the terminal portion, and the resilient compressible electrical conductor. The cradle and cap members are ultrasonically welded together along a plane of joinder and maintain under compression that portion of the resilient compressible electrical conductor which is disposed within the termination barrel and which overlies the terminal portion of the circuit trace, whereby the electrical conductor is continuously resilient biased into electrical contacting engagement with the terminal portion of the circuit trace. In accordance with a method of the invention, a compressibility factor is determined for the resilient compressible conductor and is employed in dimensioning the termination barrel so that the resilient conductor is maintained in a compressed condition within the termination barrel. The energy stored in the resilient conductor maintains the integrity of the termination.

BRIEF DESCRIPTION OF THE DRAWINGS

FIG. 1 is a fragmentary isometric view showing an in-line array of printed circuit terminations embodying the present invention and made in accordance with the invention.

FIG. 2 is a somewhat enlarged isometric view of the energy director cap member shown in FIG. 1.

FIG. 3 is an isometric view of the cradle member of FIG. 1 shown rotated 180° in a counterclockwise direction about its longitudinal axis and from its position of FIG. 1.

FIG. 4 is a somewhat enlarged fragmentary sectional view taken along the line 4, 4 of FIG. 2.

FIG. 5 is a somewhat enlarged fragmentary sectional view taken along the lien 5—5 of FIG. 3.

DETAILED DESCRIPTION OF PREFERRED EMBODIMENTS AND METHODS

Figure 6:
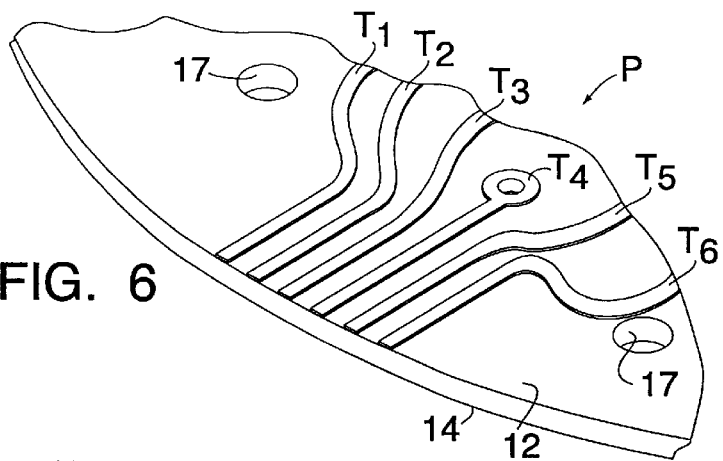
FIG. 6 is a somewhat reduced fragmentary perspective view of a panel with circuit traces thereon.

The present invention is concerned with methods for terminating one or more metallic circuit traces carried by a panel or printed circuit board and the termination or terminations produced by these methods. In the drawings and in the description which follows the invention is illustrated and described with particular reference to a typical circuit panel indicated generally by the letter P in FIG. 1 and carrying a plurality of metallic electrical circuit traces $T_1$–$T_6$. An in-line array of terminations indicated at 10, 10, embodying the present invention and made in accordance with the invention, comprise electrical connections which terminate each of the traces $T_1$–$T_6$ to an associated one of a plurality of discrete electrical conductors indicated at $C_1$–$C_6$, all of which will be hereinafter more fully described.

The panel P or at least that portion of the panel which includes terminal ends of the traces $T_1$–$T_6$ to be terminated is made from a relatively hard rigid material, that is a material which has a yield or fracture strength greater than that of the other materials utilized in making the terminations and will not undergo significant elastic deformation within a range of pressures to be encountered in forming the terminations, as will be hereinafter further discussed. Fiberglass compositions have proven particularly suitable for making the panel. However, materials such as pheonolic compounds, ceramics, metal core structures and other materials commonly used in the production of the printed circuit boards may also prove suitable for use as a panel material. The panel P has upper and lower surfaces respectively indicated at 12 and 14. Tooling holes 17, 17 are preferably provided and extend through the panel P in near relation to the terminations to receive dowel pins for locating and holding the panel P in fixed position during the terminating process hereinafter described. The discrete circuit traces $T_1$–$T_6$ on the upper surface or panel substrate 12 are preferably formed from copper and may be plated and etched on the substrate in accordance with a conventional process for making a printed circuit board.

Figure 7:
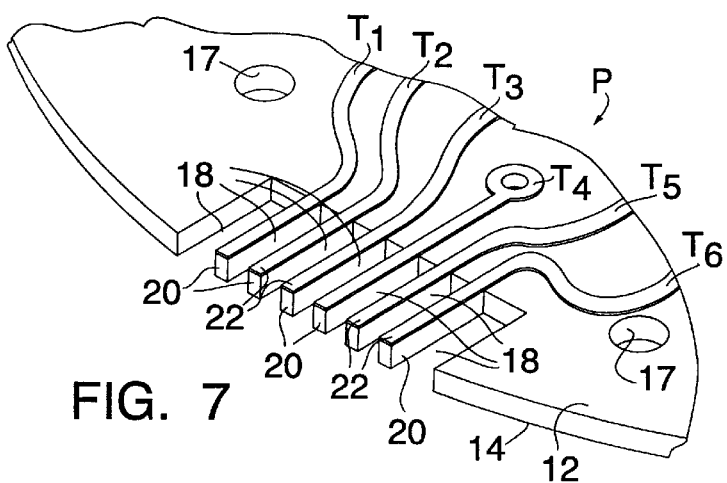
FIG. 7 is similar to FIG. 6 but shows the panel after it has been cut to form beams thereon.

Referring to FIG. 6 it will be noted that end portions of the traces $T_1$–$T_6$ are disposed in closely spaced parallel relation to each other and extend outwardly to and end at a peripheral edge of the panel P. Referring now to FIG. 7 the panel P with the metallic circuit traces $T_1$–$T_6$ thereon is further prepared for termination by cutting or otherwise forming a plurality of parallel slots 18, 18 in the panel extending inwardly from the peripheral edge of the panel between the parallel end portions of the traces $T_1$–$T_6$ and adjacent the end-most traces $T_1$ and $T_6$ thereby forming a plurality of cantilever beams 20, 20 on the panel which extend outwardly from the panel, as best shown in FIG. 5. The width of the slots or spaces 18, 18 formed between adjacent beams 20, 20 may vary. However, where a high-density array of terminations is to be formed the beams are preferably of substantially uniform width, and the width of each beam is somewhat greater than the width of each slot 18 between adjacent beams.

After the slots 18, 18 have been formed, it will be noted that an end portion of each one of the traces extends along the portion of the substrate 12 defined by an associated beam 20. The portion of each trace carried by each associated beam is hereinafter designated as a terminal portion and indicated by the numeral 22.

Resilient compressible electrical conductors, connectors and contacts of various types may be employed to terminate the circuit traces carried by the panel P and enable a wide variety of arrangements for coupling circuits on the panel P with other electronic equipment. However, the traces $T_1$–$T_6$ on the illustrated panel or printed circuit board P are terminated by a shielded cable 24 containing a plurality of flexible individually insulated resilient compressible stranded wire conductors $C_1$–$C_5$. The sixth conductor $C_6$ which is employed to terminate trace $T_6$ is an uninsulated resilient compressible solid wire conductor and serves as a drain wire for the shielded cable 24.

The individually insulated stranded wire conductors $C_1$–$C_5$ are prepared for termination by removing insulation from each of the conductors in spaced relation to its free end. Insulation is preferably thermally stripped from the stranded wire conductors in the aforesaid manner employing a well known thermal stripping process.

Termination of the traces $T_1$–$T_6$ is simultaneously effected by an ultrasonic welding process utilized to assemble the ultrasonically weldable cradle assembly indicated generally at 26 in FIG. 1 and which includes an energy director cap member, designated generally by the numeral 28 in FIG. 2, and a cradle member, shown in FIG. 3 and indicated generally at 30. The energy director cap member 28, best shown in FIG. 2 has a base 32 and a pair of transversely spaced apart sidewalls 34, 34 which extend upwardly from the base 32. A longitudinal series of upwardly facing planar surfaces 36, 36 defined by the base 32 extend transversely between the sidewalls 34, 34 and lie within a common plane. A plurality of generally rectangular and upwardly open beam receiving slots indicated at 38, 38 open upwardly through the base 32 between the surfaces 36, 36 and upwardly and outwardly through the sidewalls 34, 34, as shown in FIG. 2. A plurality of secondary energy directors 40, 40 are integrally formed on the cap member 28. Each energy director 40 is disposed generally centrally of an associated surface 36, projects upwardly from the surface and extends transversely between the sidewalls 34, 34 substantially as shown. The secondary energy directors 40, 40 are substantially alike, each having a generally triangular cross-section terminating at an apex which forms an included angle of approximately 60° as shown in FIG. 4.

Referring now to FIG. 3, the cradle member 30 is shown rotated 180° about its longitudinal axis from its position of assembly in FIG. 1. The cradle member 30 has a base 42 which defines a longitudinal series of downwardly facing surfaces 44, 44 which extend transversely of the cradle member 30 and lie within a common plane. A longitudinal series of transversely extending and downwardly open conductor receiving cradles 46,46 are formed in the base 42. Each conductor receiving cradle 46 is disposed between an associated pair of downwardly facing surfaces 44, 44 and has a generally arcuate cross-section. Each surface 44 caries a pair of primary energy directors 48, 48. The primary energy directors 48, 48 extend longitudinally of the cradle member 30. Each energy director 48 has a generally triangular cross-section characterized by an apex forming an included angle of 90°.

The cradle member 30 is constructed and arranged for mating engagement in assembly with the cap member 28 and has a width dimension substantially equal to the spacing between the inner surfaces of the sidewalls 34, 34 on the cap member. The cradle member 30 has opposite end walls 50, 50 which depend from the base 42 when the cradle member is in its assembled condition and which are adapted to be received within and substantially complement recesses 52, 52 formed in opposite ends of the energy director cap member 28. When the cradle member 30 is disposed in its preassembled position in mating engagement with the energy director cap 28 each pair of transversely spaced primary energy directors 48, 48 is disposed in crossing relation relative to an associated one of the secondary energy directors 40 on the energy director cap. In the preassembled condition each cradle 46 is disposed in registry with an associated one of the beam receiving slots 38.

Considering now the manner in which the cradle assembly 26 is assembled with the panel P to effect the various terminations 10, 10. The energy director cap 28 is preferably first positioned relative to the panel P with each beam 20 disposed within an associated beam receiving slot 38, the beams being fully seated within the slots 38, 38 and complementing associated portions of the slots. A bare or stripped portion of each of the conductors $C_1$–$C_5$ is disposed in overlying electrical contacting engagement with the terminal portion of an associated one of the traces $T_1$–$T_5$. The bare wire conductor $T_6$, which comprises a drain wire is disposed in the energy director cap in overlying electrical contacting engagement with the trace T6. The stripped portions of the insulated conductors $C_1$–$C_5$ are of sufficient length to be wholly received within the cradles 46, 46 when the cradle member 30 is in its preassembly position on the energy director cap 28.

The aforedescribed preassembled structure which includes the printed circuit panel P, the cradle assembly 26, and the conductors $C_1$–$C_6$, which may be secured in preassembled condition by an associated jig (not shown) is positioned on the horn of an ultrasonic welding machine of a conventional type. Pressure is first applied to the cradle assembly 26 by the machine to urge the cradle member 30 and the energy director cap member 28 toward assembly with each other. When a predetermined assembly pressure has been attained ultrasonic energy is applied to the cradle assembly by the machine to effect melt down of the primary and secondary energy directors by the simultaneous and combined application of ultrasonic energy and pressure. When the surfaces 36, 36 attain engagement joinder of the energy director cap member and the cradle member will occur in a plane of joinder defined by the coengaging surfaces 36, 36 and 44, 44. At this point the application of ultrasonic energy to the assembly ceases, but the pressure acting upon the assembly is maintained. Pressure is maintained for a predetermined cooling period during which the welds solidify. Thereafter, machine pressure is released allowing the finished circuit trace termination to be removed from the ultrasonic welding machine.

Figure 9:
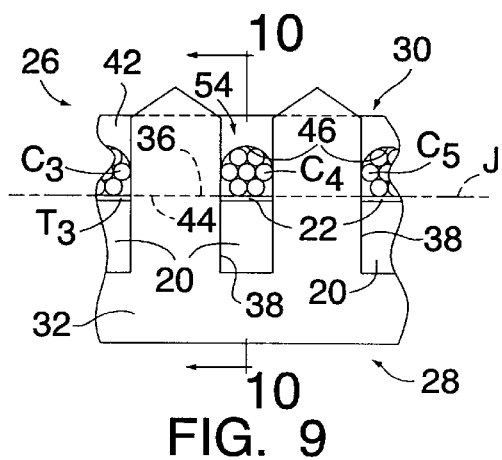
FIG. 9 is a fragmentary elevational view of a typical termination made in accordance with the present invention.
Figure 10:
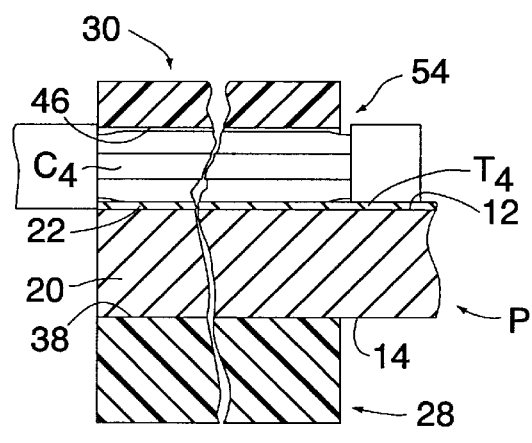
FIG. 10 is a fragmentary sectional view taken along the line 10—10 of FIG. 9.

Each termination comprises a termination barrel formed by the cooperation of a barrel receiving slot 38 with an associated conductor receiving cradle 46. A typical termination is shown in FIGS. 9 and 10 wherein the termination barrel formed by the cradle 46 and the beam receiving slot 38 is indicated generally at 54 encompasses at least parts of a beam 20, a terminal portion of a trace, and a part of an associated resilient compressible electrical conductor. The energy director cap member and cradle members are ultrasonically welded together along a plane of joinder indicated by the letter J and maintain under compression that portion of the resilient compressible electrical conductor which is disposed within the termination barrel 54 and which overlies the termination portion of the circuit trace.

The mechanical aspects of the termination and the method for making it having been explained, the dimensional relationships essential to assurance of a proper termination will now be considered.

The dimensioning requirements for the termination barrel 54 are predetermined by the physical characteristics and dimensioning of a resilient compressible electrical conductor C to be received within the termination barrel. Thus, for example, where the electrical conductor C employed in making the termination is an axially elongated stranded copper wire conductor, such as a seven strand conductor which undergoes significant physical and cross-sectional dimensional change when subjected to radially directed compressive force within the range contemplated by the method of the present invention, this factor must be considered in determining the required depth dimensions of the termination barrel 54 produced by the aforedescribed assembly process. The width dimension of the termination barrel will be substantially equal to the width dimension of the compressible conductor C and, as in the present example, where the conductor is generally cylindrical the width dimension of the termination barrel will be substantially equal to the diameter of the conductor, that is the diameter of the conductor with the insulation removed therefrom. The change in cross-sectional dimension of the conductor produced by application of a force of known magnitude acting in a radial direction upon a portion of the conductor, and hereinafter referred to as the compressibility factor, is determined for the particular conductor or conductors to be employed in terminating the terminal portions of the circuit traces. The compressibility factor is employed in determining the optimum depth dimension of the termination barrel.

Figure 11:
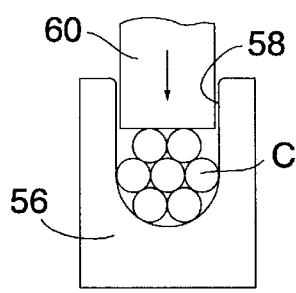
FIG. 11 is a somewhat schematic view showing a test apparatus used to determine the compressibility factor of a conductor.

Referring now to FIG. 11 the compressibility factor for a typical conductor C, may, for example, be determined by providing a test material 56, preferably the same material from which the cradle assembly is made, and forming a test slot 58 therein having a transverse dimension substantially equal to the transverse dimension of the termination barrel 54 and a bottom or inner end wall which complements an associated portion of the conductor C to be tested when the conductor C is disposed within the test slot 58. A ram 60 is provided for sliding movement within the test slot and in a radial direction relative to the conductor C disposed within the test slot. A compressing force equal in magnitude to the force to be applied to the cradle assembly 26 by the ultrasonic welder during the welding process is applied to the test conductor C by the ram 60.

Where the conductor C is a stranded wire conductor, as hereinbefore discussed, some of the initial force applied to the conductor will be absorbed in rearranging or compacting of the conductor strands. However, when the strands attain a substantially stable condition further applied force will generally be utilized to compress the material from which the test conductor C is formed. The force applied to the conductor must not, of course, exceed the elastic limit of the material from which the conductor is made. However, a force in excess of the elastic limit of the conductor is not likely to be encountered in the proper practice of the method of the present invention.

The width dimension of the beams to be formed on the panel P will be determined by the width dimension of the barrel termination slot, the latter dimension being substantially equal to the width dimension or diameter of the conductor. Thus, where cylindrical conductors are to be employed in practicing the invention the width dimension of each beam will be equal to the diameter of a conductor to be employed in terminating an associated circuit trace. The height dimension of the beam will be substantially equal to the thickness of the panel portion from which the beam is formed. The height dimension or thickness of the terminal portion of a trace measured in a vertical direction is also a known quantity.

The compressibility factor, which may be expressed as a percentage change in the dimension of the conductor in the direction of applied force is also an known quantity, having been determined by testing. Thus, the height dimension or depth of the termination barrel 54 may be calculated by determining the sum of the vertical dimensions of the beam 20, the terminal portion of a trace T, and the diameter of the conductor C less the allowance for compressibility which will occur as a result of the force applied by the ultrasonic welding machine during assembly. Thus, energy is stored within the compressed conductor which is resiliently biased toward electrically contacting engagement with the terminal portion of the trace.

Figure 8:
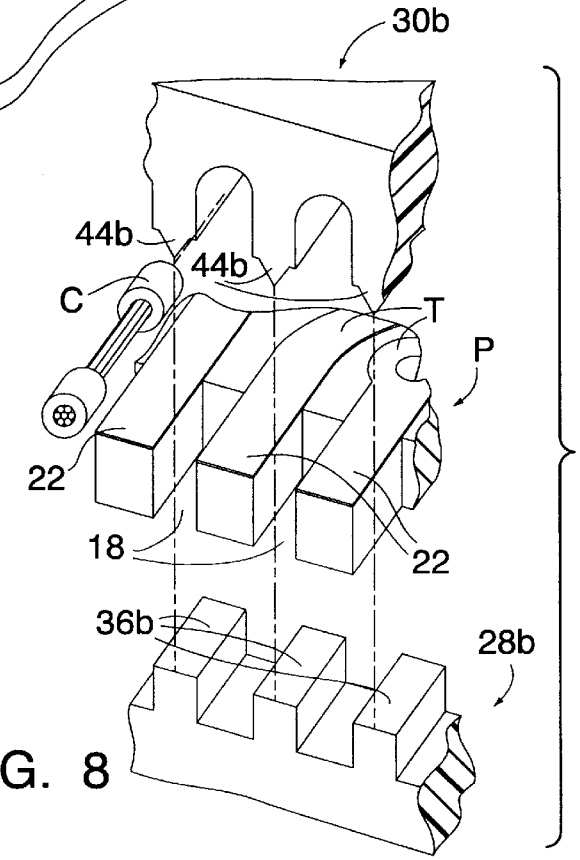
FIG. 8 is an exploded fragmentary perspective view of another typical printed circuit termination.

Further, and with respect to the embodiment shown in FIG. 8, the predetermined dimensioning of the termination, the dimensions of the energy director cap and cradle members 28b and 30b may be controlled so that the plane of joinder formed by the co-planar surfaces 44b, 44b and 36b, 36b is disposed in generally parallel relation to the upper and lower surfaces 12 and 14 of the panel P and lie within a plane substantially midway between the upper and lower surfaces of the panel. This condition is particularly desirable where the panel P is a relatively thick panel structure.

Where an in-line series of terminations is desired, but the density of the terminations in the series is not an important consideration, as in the embodiment of the invention illustrated in FIG. 1, the spacers between the termination barrels 54, 54 may have a width greater than the width of the termination barrels. Thus, the spacers which are disposed between the beams 20, 20 are wider than the beams and provide confinement of the beams on three sides to enable attainment of a high degree of structural integrity.

Figure 12:
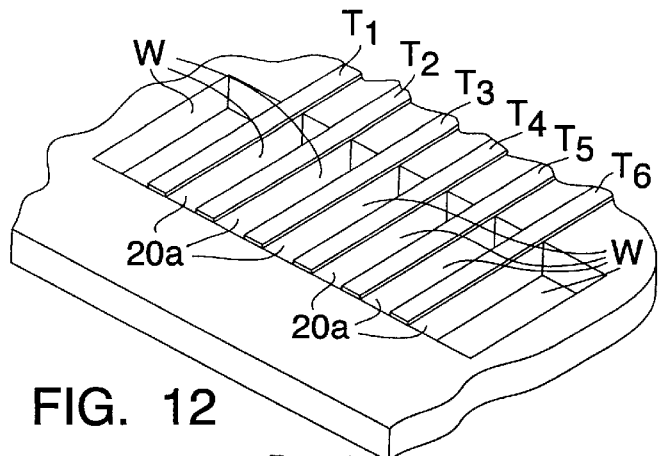
FIG. 12 is similar to FIG. 7 but shows another panel after it has been cut to form termination beams.
Figure 13:
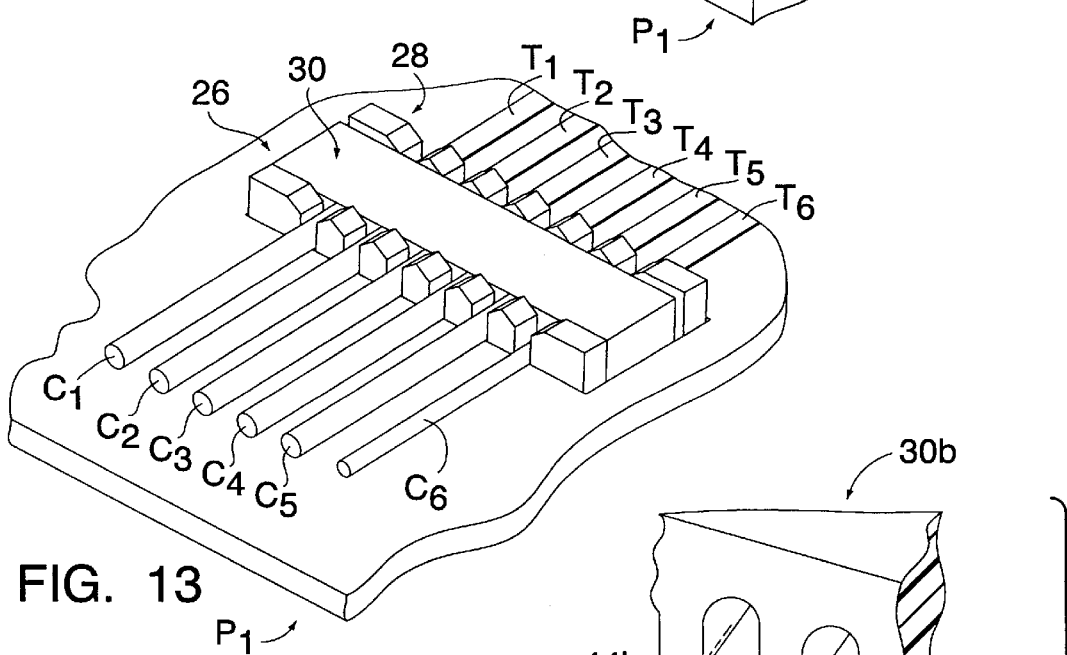
FIG. 13 is a fragmentary perspective view showing a termination formed on the panel of FIG. 12.

In FIGS. 12 and 13 there is shown another embodiment of the invention which has a panel $P_1$. Beams 20a, 20a which carry the terminal portions of the circuit traces to be terminated are disposed inboard of the peripheral edge of a panel $P_1$. The beams 20a, 20a are made by cutting or otherwise forming rectangular window openings W, W through the panel $P_1$. A cradle assembly 26 used in making the terminations is, substantially identical to the cradle assembly 26 shown in FIGS. 1–3 and is assembled with the panel $P_1$ and in engagement with the beams in the manner hereinbefore described and may be employed to connect the traces to one or more electrical components, such as electrical resistors, at positions on the panel $P_1$ and remote from the edge of the panel.

Figure 14:
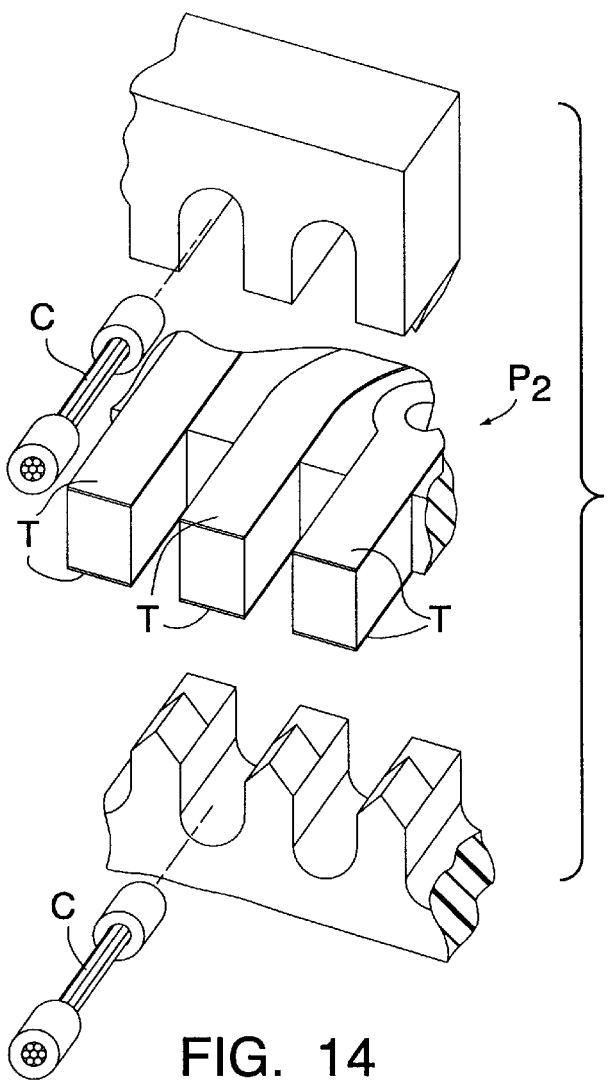
FIG. 14 is an exploded perspective view and shows another embodiment of the invention.

In FIG. 14 there is shown another embodiment of the invention wherein a panel $P_2$ is shown which has circuit traces T, T on the upper and lower sides thereof. Where identical conductors are employed to terminate the traces on the upper and lower sides of the panel an hermaphroditic cradle assembly may be employed to form the termination barrels, the energy director cap and the cradle members being substantially identical.

Figure 15:
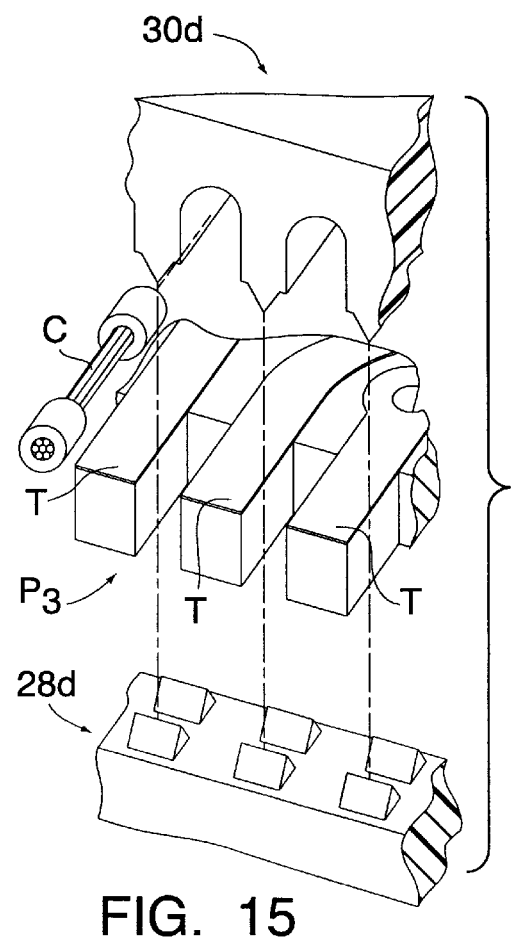
FIG. 15 is an exploded perspective view and illustrates yet another embodiment of the invention.

In FIG. 15 there is shown still another embodiment of the invention where the panel, indicated at $P_3$ is single sided relatively thin printed circuit board. The cradle member indicated at 30d and which carries the primary energy directors defines each of the termination barrels in its entirety. The assembly is joined along a plane of joinder which lies generally within the plane of the lower surface of the panel.

What is claimed is:

1. A printed circuit termination comprising, a panel, at least a portion of the panel being substantially rigid and having substantially parallel upper and lower surfaces, at least one of said surfaces defining a substrate, said portion of the panel defining a beam, a circuit trace carried by said substrate and having a terminal portion extending along said beam, a resilient compressible electrical conductor disposed in overlying electrical contacting engagement with said terminal portion, and a cradle assembly made from ultrasonically weldable material and including a cradle and a cap, said cap cooperating with said cradle in assembly to define a termination barrel receiving and confining therein at least portions of said beam, said terminal portion and said resilient compressible electrical conductor, said cradle and said cap being ultrasonically welded together along a plane of joinder generally parallel to and spaced from said substrate and maintaining under compression that portion of said resilient compressible electrical conductor which is disposed within said termination barrel whereby said electrical conductor is continuously resiliently biased into electrical contacting engagement with said terminal portion of said circuit trace.

2. A printed circuit termination as set forth in claim 1 wherein said plane of joinder is parallel to and spaced from said upper and lower surfaces.

3. A printed circuit termination as set forth in claim 2 wherein said plane of joinder is disposed generally midway between said upper and lower surfaces.

4. A printed circuit termination as set forth in claim 1 wherein said substrate is defined by said upper surface and said plane of joinder is generally coincident with a plane of said lower surface.

5. A printed circuit termination as set forth in claim 1 wherein said beam is further characterized as a cantilever beam.

6. A printed circuit termination as set forth in claim 5 wherein said beam extends outwardly from said at least a portion of said panel.

* * * * *